United States Patent [19]

Bonora

[11] Patent Number: 4,458,152

[45] Date of Patent: Jul. 3, 1984

[54] PRECISION SPECULAR PROXIMITY DETECTOR AND ARTICLE HANDING APPARATUS EMPLOYING SAME

[75] Inventor: Anthony C. Bonora, Atherton, Calif.

[73] Assignee: Siltec Corporation, Menlo Park, Calif.

[21] Appl. No.: 376,299

[22] Filed: May 10, 1982

[51] Int. Cl.³ .................. G01P 13/00; B65H 7/14
[52] U.S. Cl. ................... 250/353; 414/331; 350/433
[58] Field of Search ............ 250/353, 221, 357.1, 250/358.1, 359.1, 571; 356/429; 350/433; 414/331

[56] References Cited

U.S. PATENT DOCUMENTS 3,902,615 9/1975 Levy et al. .................. 414/331
4,044,250 8/1977 Fetzer ......................... 250/216

FOREIGN PATENT DOCUMENTS 572674 2/1958 Italy ........................... 250/571
2011609 7/1979 United Kingdom .......... 356/429
323650 2/1972 U.S.S.R. .................... 356/429

OTHER PUBLICATIONS

J. W. Sedlak, "Sensing of Carrier Supported Wafers," *IBM Technical Disclosure Bulletin*, vol. 12, No. 1, (Jun. 1969), p. 183.

*Primary Examiner*—Janice A. Howell
*Assistant Examiner*—Constantine Hannaher
*Attorney, Agent, or Firm*—C. Michael Zimmerman

[57] ABSTRACT

Infrared radiation is focused to a line at a site at which a semiconductor wafer is expected to appear when a wafer is transferred with, i.e., loaded onto or unloaded from, a semiconductor wafer conveyor. A cylindrical lens of selected focal length is positioned to receive and focus to a line at an image plane radiation reflected by a wafer arriving at the site. An apertured stop defines an opening at the image plane to pass reflected radiation to an infrared sensor positioned on the side of the stop opposite the cylindrical lens.

21 Claims, 5 Drawing Figures

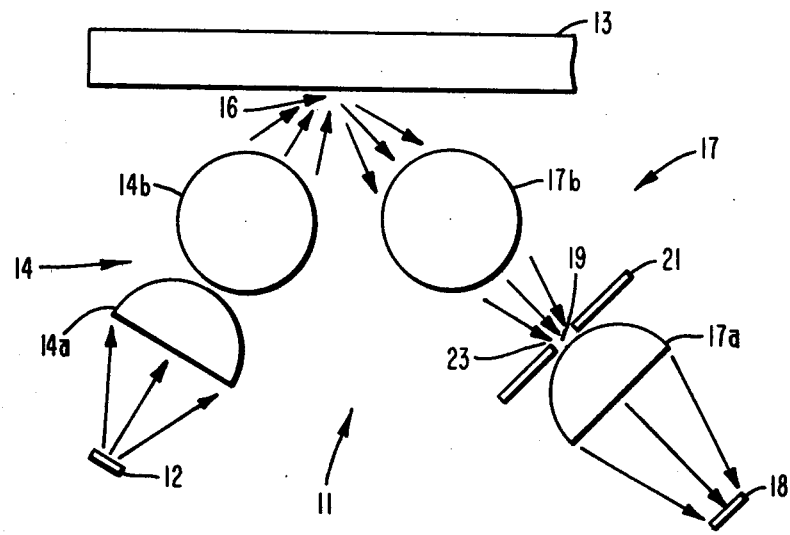
FIG_1A
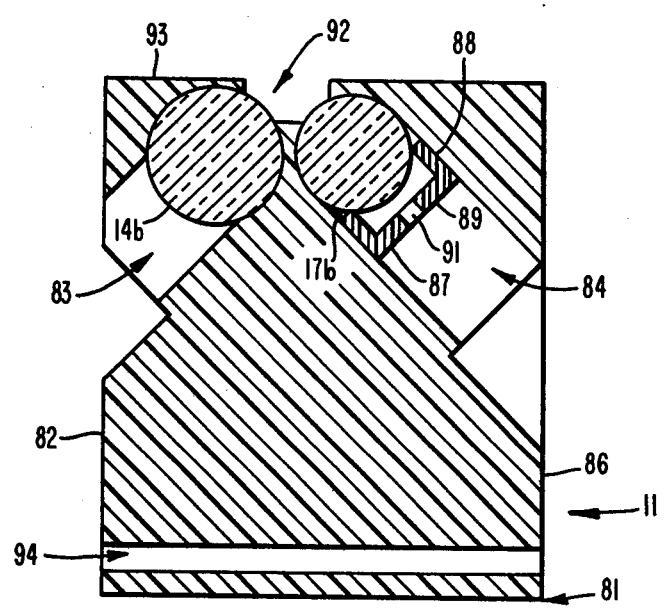
FIG_1B

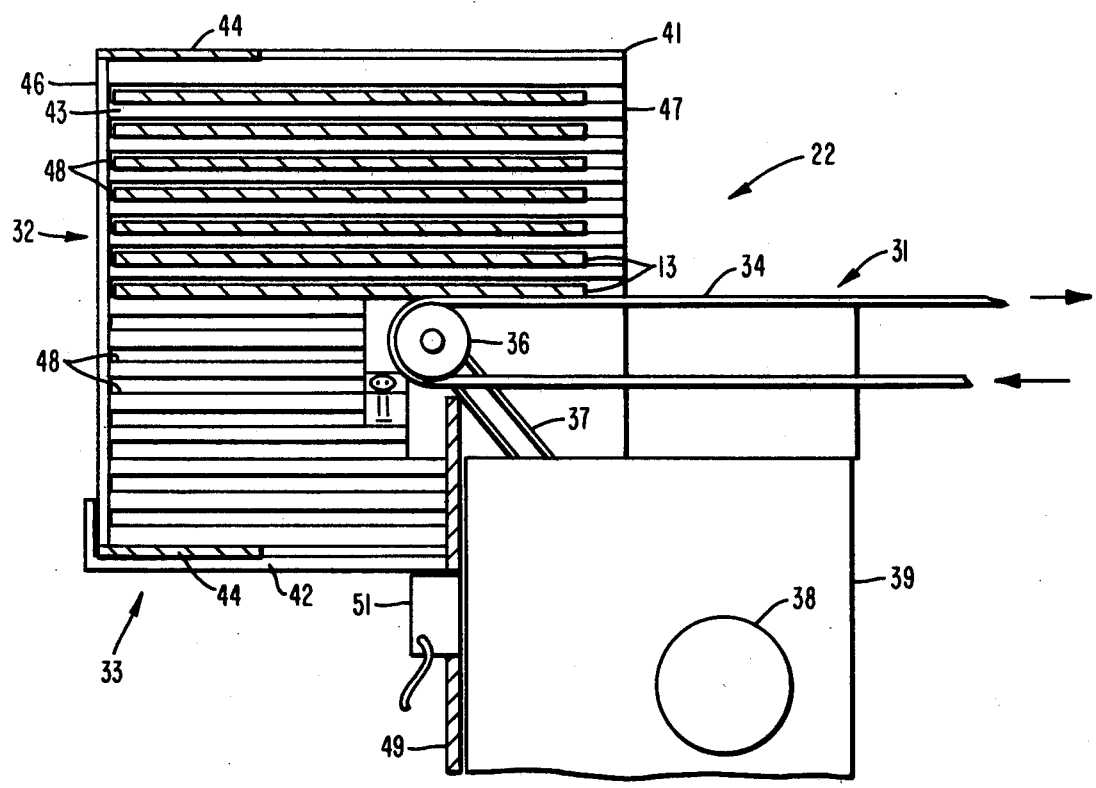
FIG_2
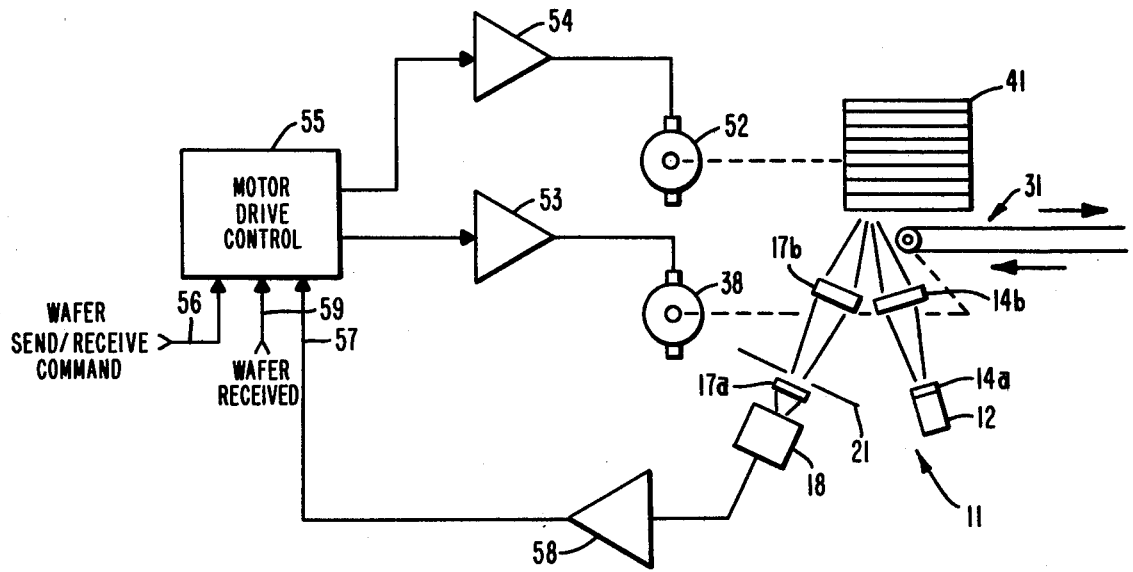
FIG_3

PRECISION SPECULAR PROXIMITY DETECTOR AND ARTICLE HANDING APPARATUS EMPLOYING SAME

BACKGROUND OF THE INVENTION

The present invention relates generally to specular proximity detectors adaptable for use in article handling equipment. More particularly, however, this invention is a specular proximity detector capable of sensing with precision the presence of articles at a selected location and an article handling apparatus capable of positioning articles at precise locations determined by the precision specular proximity detector.

Proximity detectors are widely used to determine the arrival of articles at precisely specified locations. Most determine the arrival by measuring a physical property of either the environment established at the location or of articles arriving at the location to obtain an indication of the distance separating the specified location from the detecting element of the proximity detector. For example, capacitive devices measure the electric field established in the region of the specified location. When an article having a known dielectric coefficient is positioned at the specified location, the established electric field is disturbed in a predictable manner. The predictable disturbance is utilized to indicate the arrival at the specified location of articles of known dielectric coefficient.

Ultrasonic devices measure ultrasonic energy either reflected from or transmitted through the specified location. When an article having a known ultrasonic energy absorption coefficient is positioned at the specified location, the reflected or transmitted ultrasonic energy is altered in a predictable manner. The predictable alteration is indicative of the arrival at the specified location of articles of known ultrasonic energy absorption coefficient.

Air jet devices establish a high velocity air stream through the specified location and the air flow is measured to obtain an indication of the arrival of articles at the specified location. When an article establishing a known air flow impedance is positioned at the specified location, the air flow through the location is altered in a predictable manner. The predictable alteration of the established air flow is utilized to indicate the arrival at the specified location of articles establishing a known air flow impedance in the path of the air flow.

Specular proximity detectors assure radiation reflected from the specified location. When an article having a known coefficient of reflectivity is positioned at the specified location, a predictable fraction of incident radiation is reflected to a radiation sensitive element, the predictable fraction indicating the arrival of the articles at the specified location.

While such proximity detectors are satisfactory for determining the arrival at a specified location of articles having a certain predictable property, they are unreliable when used to determine the arrival of articles whose property being measured is unpredictable or varies widely over a range. For example, semiconductor wafer handling apparatus are employed to facilitate the automatic manufacture of semiconductor materials and fabrication of semiconductor devices. Usually, such apparatus are required to manipulate wafers of a variety of sizes, shapes and semiconductor materials as they are conveyed through a series of testing and inspecting stations for the performance of quality control operations. In highly automated semiconductor manufacturing plants, the wafers are transported by a moving conveyor from a wafer loading station, through the testing and inspecting stations to a wafer unloading station. The wafers are sequentially loaded onto the conveyor from and unloaded from the conveyor to wafer magazines, commonly called "cassettes", each having the capacity to hold several wafers. Wafer magazines have come to be standardized. The standardized magazines store the wafers in a vertical stack so that they can be withdrawn from and deposited in the magazine by machine-controlled means when loading and unloading the conveyor. In one type of wafer handling apparatus, the magazines are located above the conveyor and the moving conveyor is employed to withdraw and deposit the wafers,. As the wafers are withdrawn from (or deposited in) a magazine, the magazine is moved incrementally along a line perpendicular to the conveyor, whereby each wafer is gently engaged by the moving conveyor to withdraw it (or is gently placed in the magazine by the moving conveyor to deposit it). To insure gentle handling of the delicate semiconductor wafers, the incremental movements of the magazines are carefully controlled by proximity detectors that function to detect the position of the magazines precisely relative to the moving conveyor. Proximity detectors of the kind referred to briefly hereinbefore require alignment whenever the wafer handling apparatus is required to manipulate wafers of different measured property. However, alignment of the proximity detectors does not avoid proximity detection errors resulting from normal variations in the measured property of semiconductor wafers of the same kind.

As will be described in detail hereinafter, the present invention utilizes a specular proximity detector capable of reliably sensing the presence of articles at a specified location, which articles may have a coefficient of reflectivity lying anywhere within a wide range. Generally, specular proximity detectors employed in semiconductor wafer handling apparatus have utilized infrared and visible light radiation projected through the site at which the wafers are to be detected. When a wafer arrives at the site, the projected radiation is reflected to a photosensitive transducer, which responds by providing an indication of the arrival of the wafer, hence, wafer magazine at the desired position for loading or unloading wafers with respect to the moving wafer conveyor.

One typical infrared proximity detector employs an infrared emitter and cooperating beam-forming apertured colliminator positioned to allow a beam of infrared radiation of small divergence to be projected along a path defining a selected angle of incidence at its intersection with the potential site of the wafers to be detected. An infrared-sensing transducer and cooperating mask are positioned along a line in the incident plane defining the angle of reflection at the intersection of the incident beam and potential wafer site.

Such proximity detector is characterized by numerous disadvantages. A majority of the radiation generated by the infrared emitter is intercepted by the collimating structure and wasted in the process of collimating the beam, making the proximity detector inefficient. In addition, the apertured collimator only partially collimates the infrared beam. Consequently, the formed incident infrared beam and the reflected beam each are in the form of a diverging cone. This beam divergence and the reflected beam acceptance angle defined by the mask position along the reflected beam line limits the resolution of distance discrimination of the proximity detector. Variations in wafer surface finish produce an additional negative effect. A relatively non-reflective surface reflects less energy into the beam acceptance angle defined by the mask positioned along the reflected beam line than a highly reflective surface. As a result, the response of the infrared-sensing transducer varies widely with the typical variation in coefficient of reflectivity of the various semiconductor materials from which wafers are made. The output of such transducers has been found to vary by a factor of 600 to 1 for semiconductor wafers of different common surface properties and coatings. Assuming such proximity detector is aligned to provide an indication of wafers of average coefficient of reflectivity being positioned at the desired site, wafers having a highly reflective surface will produce a false indication of such positioning when the wafers are farther from the reflected beam sensor. On the other hand, wafers having a relatively non-reflective surface will not reflect sufficient energy to produce even a false indication regardless of their distance from the reflected beam sensor.

In semiconductor wafer handling apparatus where proximity detectors are employed to control the positioning of wafer magazines relative to a moving wafer conveyor, such false or failure of indications cause mispositioning of the magazines. Usually, the delicate semiconductor wafers are damaged or destroyed during wafer withdrawal or insertion operations attempted with mispositioned magazines. Such false or failure of indication can be avoided only by adjusting the alignment of the proximity detector for wafers of different ranges of coefficient of reflectivity. Besides complicating the use of the apparatus employing such proximity detectors, the reflectivity of semiconductor wafers of a particular material composition and configuration is not uniform, varying enough to cause occasional false or failure of indication of the presence of a wafer at a selected location.

It has been proposed to incorporate a point-focus lens system in specular proximity detectors to avoid the proximity detection unreliability growing out of the aforementioned disadvantages. In such detectors, a convex converging lens or series of lenses is positioned to focus the emitted radiation at a point at the site at which the wafers are to be detected. While the proximity detection reliability is improved over those aforedescribed apertured collimating specular proximity detectors, the use of a point-focus lens system has a major drawback. Very accurate optical alignment is necessary in specular proximity detectors employing a point-focus lens system to assure that the spot of maximum beam intensity is coincident with the desired point of sensitivity of the reflected radiation sensor. The necessity of accurate optical alignment complicates the manufacture and installation of the proximity detector, and adds to the expense of their manufacture and installation. Furthermore, such proximity detectors are subject to becoming misaligned frequently when used in environments such as found in automated semiconductor wafer handling apparatus where considerable movement of mechanical parts and operator manipulation of apparatus components and handled wafers occur.

SUMMARY OF THE INVENTION

As will be described hereinafter, the present invention is a specular proximity detector that avoids the aforementioned disadvantages and drawbacks while providing reliable sensing at a specified location of the presence of articles having a wide range of coefficients of reflectivity. The proximity detector of this invention achieves such reliable sensing efficiently, without the need of very accurate alignment of its beam directing components and without the need of adjustment for sensing articles of widely different configurations and coefficients of reflectivity. Moreover, the proximity detector offers particular advantages in its adaption for use in article handling apparatus, especially where delicate articles are susceptible to being damaged through mishandling caused by improper operation of proximity detectors.

BRIEF DESCRIPTION OF THE DRAWINGS

The objects, advantages and features of the present invention will become more apparent upon consideration of the following description and appended claims taken together with the accompanying drawings, which illustrate one preferred embodiment of the present invention and wherein:

FIG. 1A is a schematic diagram of a preferred embodiment of the specular proximity detector of the present invention arranged to sense the presence of semiconductor wafers manipulated by a wafer handling apparatus;

FIG. 1B is a cross section side elevation view of the specular proximity detector of the present invention illustrating a preferred construction thereof;

FIG. 2 is a schematic partial sectional elevation view of a preferred embodiment of the semiconductor wafer handling apparatus of the present invention;

FIG. 3 is a block diagram of the control system of the wafer handling apparatus of FIG. 2.

DESCRIPTION OF THE PREFERRED EMBODIMENT

Figure 4:
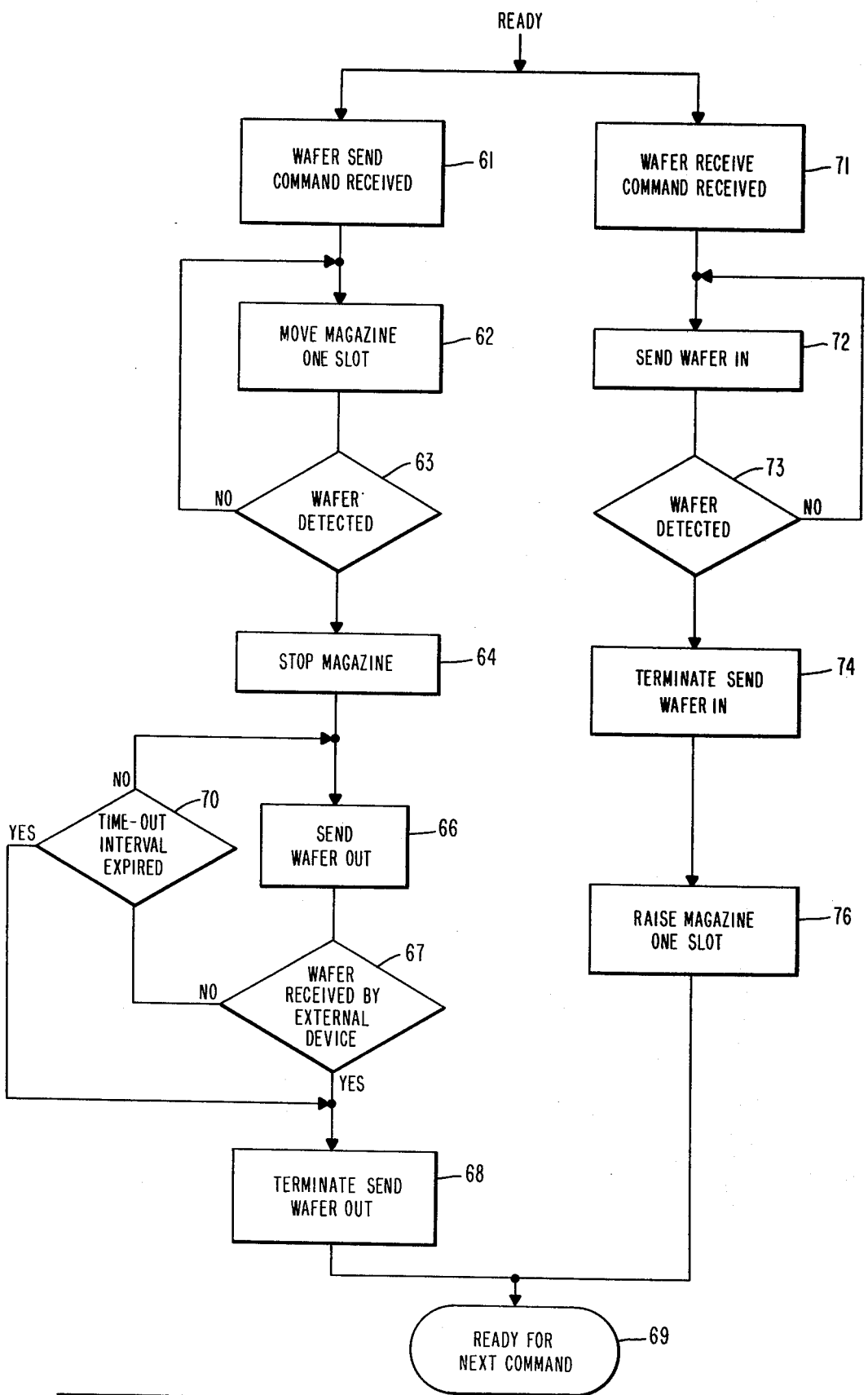
FIG. 4 is a logic flow diagram depicting the sequence of operations performed by a preferred embodiment of an exemplary control system detector of FIG. 3 to effect the loading and unloading of semiconductor wafers in the semiconductor wafer handling apparatus of FIG. 2.

Referring to FIG. 1A, the specular proximity detector 11 of the present invention includes a radiation emitter 12 selected to generate and emit radiation of a wave length susceptible to focusing and to substantial reflection by articles 13 whose presence at a selected site 16 is to be determined by the detector. A converging line focusing optical element or lens system 14 is positioned to intercept radiation emitted by the emitter 12 and focus it to a line at the selected site 16 at which the presence of articles is to be determined. The combination formed by the emitter 12 and line focusing lens system 14 constitutes a means for forming a focused line of radiation at the site 16 at which the presence of articles is to be determined.

In accordance with a particularly salient feature of the present invention, another converging line focusing optical element or lens system 17 is positioned to intercept radiation reflected from the site 16 and direct the reflected and intercepted radiation to a radiation sensor 18. The radiation sensor 18 is selected to provide an indication of the intensity of reflected radiation striking it. By employing a converging line focusing lens system 17 to intercept radiation reflected from the site 16 of a focused line of radiation and direct it to the radiation sensor 18, a high percentage of radiation reflected from site 16 is collected and sensed. Furthermore, the intensity of reflected radiation directed to the radiation sensor 18 by the converging line focusing lens system 17 decreases rapidly when reflected radiation originates at locations away from the site 16 in directions towards or away from the specular proximity detector. The use of a focused line of radiation to detect the presence of an article 13 at site 16 relaxes the lens alignment requirement of the specular proximity detector 11. As a result of these characteristics, the specular proximity detector 11 of the present invention is able to sense the presence at site 16 of articles 13 of widely different configurations and coefficients of reflectivity and reliably discriminate such presence from presences at other locations closer to or farther from the detector. Moreover, the use of converging line focusing lens systems 14 and 17 to collect and direct emitted and reflected radiation enhances the sensitivity and efficiency of the specular proximity detector 11. Efficiency is enhanced because the emitter power required to produce a given intensity level of reflected radiation at the radiation sensor 18 is less than would be required if the converging line focusing lens systems 14 and 17 were omitted. The sensitivity of the detector 11 is enhanced because changes in the intensity of reflected radiation directed to the sensor 18 resulting from given chances in article position are larger than would occur in the absence of the converging lens systems 14 and 17.

In the preferred embodiment of the specular proximity detector 11 of the present invention, each of the converging line focusing lens systems 14 and 17 includes a pair of converging lenses. More specifically, lens system 14 includes a converging point focus spherical lens 14a located to collect radiation emitted by radiation emitter 12 and direct it to a converging line focus cylindrical lens 14b. The cylindrical lens 14b focuses the radiation received from the spherical lens 14a to a line at the selected site 16. The spherical lens 14a serves to collect radiation emitted by the radiation emitter 12 and direct it to impinge the facing surface of the cylindrical lens 14b along its length. The cylindrical lens 14b serves to direct the received radiation to a line parallel to its length at the selected site 16. The location of the site 16 relative to the emitter 12 is determined by the combined focal lengths and relative positions of the pair of lenses 14a and 14b. A focused line of radiation can be formed at the selected site 16 by a lens system 14 consisting of a single converging cylindrical lens located to collect a substantial part of the radiation emitted by the emitter 12.

With reference to the converging lens system 17, it also includes a spherical lens 17a and a cylindrical lens 17b. The cylindrical lens 17b focuses radiation reflected from the selected site 16 to a line at the the image plane 19 of the cylindrical lens. The spherical lens 17a is positioned to receive reflected radiation focused at the image plane 19 and direct the focused line of radiation onto the radiation sensor 18. If an elongated radiation sensor is utilized, a lens system 17 can be employed that includes a single converging cylindrical lens.

The ability of the specular proximity detector 11 to discriminate positions of articles 13 relative to the detector is a function of the range of distances within which articles reflect radiation to the radiation sensor 18 at or exceeding a threshold intensity level selected to be indicative of articles being positioned at a selected position relative to the detector 11. The smaller the range, the finer the degree of discrimination obtained. In accordance with another salient feature of the present invention, very fine discrimination is obtained by placing an apertured stop 21 between the cylindrical lens 17b and the spherical lens 17a to intercept and block the passage to the spherical lens and following radiation sensor 18 of radiation reflected from articles 13 positioned at locations other than at site 16. In the preferred embodiment, the apertured stop 21 is located at the image plane 19 and the spherical lens 17a is located just beyond the image plane. In other converging line focusing lens system 17, however, the stop 21 may be located at other positions relative to the lenses of the system to effect interception and blockage of the passage to the radiation sensor 18 of radiation reflected from articles 13 positioned at locations other than at site 16. When an article 13 is located at site 16, the greatest fraction of the projected line of radiation formed at site 16 by the cooperating emitter 12 and lens 14 is reflected towards the lens system 17 along a selected reflection path extending through the passage 23 formed by the stop 21. Furthermore, the cylinderical lens 17b focuses substantially all of the reflected radiation at the image plane 19, whereby it passes to radiation sensor 18 unimpeded by the apertured stop 21. However, when an article 13 is located a little closer to or farther from the proximity detector 11, radiation is reflected along a different reflection path and is directed by the cylindrical lens 17b to one side or the other of the passage 23. Under these circumstances very little reflected radiation passes the apertured stop 21 to reach the radiation sensor 18. As will be appreciated further from the following description of a preferred embodiment of the specular proximity detector 11 of the present invention, the specular proximity detector of this invention is capable of very fine discrimination of the position of articles relative to the detector for articles whose coefficient of reflectivity falls within an exceedingly wide range of coefficients of reflectivity. For certain applications of the proximity detector 11, such as the detection of the position of semiconductor wafers in wafer handling apparatus 22 (FIG. 2), the discrimination capability of the specular proximity detector 11 is virtually independent of the reflectivity of the articles 13 because the coefficients of reflectivity of the different articles being detected fall within the exceedingly wide coefficient of reflectivity range of the detector.

A preferred embodiment of the specular proximity detector 11 arranged for use in the semiconductor wafer handling apparatus 22 illustrated in FIG. 2 includes a gallium-arsenide (GaAs) infrared emitting diode emitter 12 marketed by Optron, Inc. under model designation OP-132. Optron, Inc. packages the infrared emitter 12 with a converging spherical lens having one spherical surface and one flat surface. This Optron, Inc. spherical lens is utilized in the detector 11 to perform the function of lens 14a. The spherical lens 14a is located relative to the infrared emitter 12 in the OP-132 to collect the radiation from the emitter and direct it along a path that diverges from the emitter 12 at a solid emission angle of ten degrees. In the preferred embodiment the cylindrical lens 14b is placed as close as practicable to the spherical lens 14a to intercept substantially all radiaton leaving the spherical lens, thereby minimizing waste. Infrared radiation emitters are preferred for use in specular proximity detectors employed in semiconductor wafer handling apparatus 22 because of the insensitivity of such detectors to ambient light present in the environment of wafer handling apparatus. Furthermore, infrared emitters are reliable, inexpensive, simple and compact structures.

Each cylindrical lens 14b and 17b is a line focusing element in the form of a quartz rod having a diameter selected for the desired focal length and a length selected for the desired length of the focused line at site 16. Quartz is selected for the lens material because of its high transmittance in the infrared spectrum range. For the detectors employed in the semiconductor wafer handling apparatus 22 illustrated in FIG. 2, the quartz rod cylindrical lens 14b has a diameter of about 0.64 cm and a length of about 0.56 cm, defining a focal length of about 0.6 cm. The quartz rod cylindrical lens 17b has a diameter of about 0.48 cm and a length of about 0.5 cm, defining a focal length of about 0.5 cm. The lens 17b has a focal length less than lens 14b to facilitate compact packaging of the components forming the specular proximity detector 11, with the lens 17b positioned a distance from the site 16 greater than its focal length.

The apertured stop 21 defines an elongated passage 23 having a width in the direction of convergence of the focused infrared beam formed by the lens 17b of about 0.1 cm, although a width in the range of about 0.05 cm to about 0.13 cm is suitable for the wafer handling apparatus illustrated in FIG. 2. The length of the elongated aperture 23 is set at about 0.35 cm, which is shorter than the length of the focused line of reflected infrared formed by the lens 17b. The elongated aperture 23 can be in the form of a continuous rectangular slot or, for convenience of manufacture, it can be defined by a series of closely spaced drilled holes distributed over the aforementioned aperture length, each of a diameter corresponding to the aforementioned aperture width.

The sensor 18 is an infrared sensitive silicon-type phototransistor marketed by Optron, Inc. under the model designation OP-830. This phototransistor sensor 18 has an infrared-sensitive transducer located about 0.6 cm from the apertured stop 21. The sensor 18 is packaged by Optron together with a converging spherical lens, having one spherical surface and one flat surface. This Optron, Inc. spherical lens is utilized in the detector 11 to perform the function of the lens 17a. The sensor 18 is located relative to the spherical lens 17a to define a solid acceptance angle of ten degrees for receiving and detecting radiation.

The discrimination capability of the specular proximity detector 11 of the present invention renders the detector particularly suited for use in controlling the loading and unloading of semiconductor wafers onto and from a moving wafer conveyor of wafer handling apparatus. Semiconductor wafers are fragile structures, requiring great care in handling in order to avoid accidental damage or destruction. In automated semiconductor wafer handling apparatus, the semiconductor wafers are stored in a vertical stack in magazines from which they are automatically withdrawn for loading the conveyor and into which they are automatically deposited for unloading the conveyor. After each withdrawal or deposit of a wafer, the magazine is moved with respect to the conveyor to position it for the next wafer withdrawal or deposit. The magazines are located relative to the conveyor so that the conveyor itself withdraws the wafers from and deposits the wafers in the magazines. In order to accomplish this loading and unloading of wafers automatically and gently so that the wafers are not damaged or destroyed in the process, the movement and positioning of the magazines must be controlled to locate them precisely with respect to the moving wafer conveyor. The discrimination capability of the specular proximity detector 11 of the present invention is uniquely suited for this purpose.

As discussed hereinbefore, the specular proximity detector 11 is capable of discriminating the position of articles having coefficients of reflectivity over an exceedingly wide range. This is a particularly important advantage to semiconductor wafer handling apparatus. Typically, such apparatus is employed to handle semiconductor wafers having a wide variety of surface reflectivity and finish characteristics. Some semiconductor wafers have surfaces that are highly polished, thereby reflecting a greater fraction of incident radiation. Others have a granular surface that widely scatters incident radiation, thereby reflecting a considerably lesser fraction of incident radiation in the general direction of the line of reflection along which the sensor 18 is disposed. Semiconductor wafers having a granular surface finish have a lower effective coefficient of reflectivity than the same wafer material having a highly polished surface finish. Because of the superior discrimination capability of the specular proximity detector 11 of the present invention, the aforedescribed preferred embodiment is able to detect the presence of wafers at site 16 having surfaces whose effective coefficient of reflectivity may vary over a range of about from 1.0 (100% reflection) to less than 0.01.

The article handling apparatus 22 of the present invention employing the above-described specular proximity detector 11 will now be described with particular reference to FIG. 2. The article handling apparatus 22 illustrated in FIG. 2 is arranged to convey semiconductor wafer articles 13 to another wafer conveyor (not shown) which transports the wafer articles through a series of stations (not shown) for sorting, testing and inspecting the semiconductor wafers 13. In such apparatus, wafers 13 are loaded onto a moving wafer conveyor 31 (only a length being shown in FIG. 2) from a vertically positionable magazine 32 located at a wafer loading station 33. In the preferred embodiment, the moving wafer conveyor 31 includes a pair of horizontally disposed and spaced belts 34, extending between a drive roller 36 and an idler, return roller (not shown). The rollers are driven in a controlled manner by a timing belt 37 that engages the drive roller 36 and drive motor 38. The rollers and drive motor are fastened to a framework 39 that supports the wafer handling apparatus 22.

For convenience, the movable magazine 32 is an industry-standard semiconductor wafer cassette, such as the model PA-72 marketed by Fluoroware, Inc., which can accommodate wafer sizes from about 5 to 15 cm in diameter. In the illustrated wafer handling apparatus 22, the vertical position of the magazine 32 is controlled relative to the upper surface of the moving belts 34 to discharge or off-load wafers 13 onto the belts from the bottom of the magazine and load wafers into the magazine from the top of the magazine. The industry-standard magazine 32 includes a wafer rack 41 supported by a vertically-movable platform 42 within a surrounding, protective magazine housing (not shown). The wafer rack 41 includes a pair of opposing side panels 43 joined at their tops and bottoms by connecting webs 44. The connecting webs 44 extend from the rear (relative to the location of the moving conveyor 31) edge 46 of the side panels 44 only a short distance towards the opposite front edge 47 to provide clearance for the extension into wafer rack 41 of the moving conveyor 31. As discussed hereinbefore and as will be described in further detail hereinbelow, the moving conveyor 31 extends into the magazine 32 to withdraw and deposit wafers 13.

To support wafers 13 in the magazine 32, the wafer rack 41 has a plurality of vertically disposed ledges 48 horizontally extending along the facing surfaces of the side panels 44. The ledges 48 are conveniently formed by horizontally extending channels formed by recesses cut in the facing surfaces of the side panels.

This wafer rack construction permits the moving conveyor 31 to extent into the space defined by the opposing side panels 43 as it engages semiconductor wafers 13 within the magazine 32. When withdrawing a wafer 13 from the magazine 32, the movable platform 42 is lowered until the pair of conveyor belts 34 engage the lowest most wafer in the rack 41. When depositing a wafer 13 in the magazine 32, the movable platform 42 is raised until the first empty channel defined by ledges 48 below a stored wafer 13 is in position to receive a wafer being unloaded from the moving conveyor 31. The manner in which the wafer handling apparatus 22 is controlled to load wafers onto and unloaded wafers from the moving conveyor 31 will be described in further detail hereinbelow with reference to FIGS. 3 and 4, which illustrate a control system and a logic flow diagram for the control system, respectively, suitable for use in controlling semiconductor wafer handling apparatus of the kind illustrated in FIG. 2. In any event, such loading and unloading is accomplished by carefully controlled and precise movement of the movable platform 42. In the preferred embodiment, the platform 42 is moved vertically by a precision lead-screw mechanism, including a vertically extending lead-screw 49 and a driven screw follower 51. The follower 51 is driven in a controlled manner by a motor (not shown in FIG. 2) to travel along the lead-screw 49 in increments as the magazine 41 supported on the movable platform 42 is positioned relative to the moving conveyor 31 to discharge or receive wafers 13. The positioning of the magazine 41 is controlled by the specular proximity detector 11 located proximate the location at which wafers 13 leave or are placed on the moving conveyor 31. As described hereinbefore, the specular proximity detector 11 is able to detect with a high degree of precision when an article is located at a particular distance from it, even when the effective coefficient of reflectivity of the articles to be detected may vary over a considerable range, as found in semiconductor wafer handling apparatus. This feature of the proximity detector 11 is employed to advantage in the semiconductor wafer handling apparatus 11 of the present invention to control the movements of the moving conveyor 31 and of the movable platform 42.

Referring now to FIG. 3, the specular proximity detector 11 controls the moving conveyor 31 and the position of the magazine 41 carried by the movable platform 42 (FIG. 2) by controlling the drive supplied to their respective associated motors 38 and 52. More particularly, each of the motors is driven by respective motor drive amplifiers 53 and 54 in response to commands received from the motor drive control 55. As discussed hereinbefore, the operation of the magazine 41 and moving conveyor 31 during the loading of wafers 13 onto the conveyor is different from that which occurs during the unloading of wafers from the conveyor. The operation of the motor drive control 55 during the withdrawal of wafers 13 from the magazine 41 will now be described with the aid of the logic flow diagram of motor drive control system illustrated in FIG. 4. Such operation will be described assuming the lower-most wafer in the magazine 41 is already positioned above the proper location for withdrawal by the moving conveyor 31 and the motor drive control 55 of the semiconductor wafer handling apparatus 11 is ready to execute the commands for effecting such withdrawal. The motor drive control 55 wats for the receipt of an operator initiated wafer send command at step 61. Upon receipt of the wafer send command at the input 56, the motor control 55 responsively generates and issues a lower magazine command at step 62. This later command is coupled to the motor drive amplifier 54 to drive the motor 52 operatively associated with the screw follower 51 (FIG. 2) to cause the follower to travel downward along the lead-screw 49 to lower the platform 42, hence, magazine 41 one wafer position. As the magazine is lowered, the motor drive control 55 tests at step 63 for the presence of a wafer 13 at the desired location for withdrawal from the magazine 41. The motor drive control performs this test by monitoring the output from the radiation sensor 18 received at input 57 from the amplifier 58. The amplifier 58 is coupled to the radiation sensor 18 to provide an output indicative of a wafer 13 being positioned at the desired location whenever the sensor receives radiation reflected from a length of the focused line of radiation formed at the desired location by the lens system 14. As long as the lower-most wafer 13 stored in the magazine 41 is above the proper location for withdrawal from the magazine, the infrared projected through that location by the cooperation of the emitter 12 and converging lens system 14 and reflected (if any) follows an angularly different reflection path relative to the converging lenses 17b, intersecting the plane of the apertured stop 21 at one side or the other of the passage 23. Consequently, reflected radiation passing stop 21 and reaching the infrared sensor 18 will be insufficient to cause the amplifier 58 to activate the motor drive control 55. However, when the lower-most wafer 13 arrives at the proper location for withdrawal from the magazine 41, the amount of radiation reflected along the selected reflection path to reach the infrared sensor 18 increases considerably, causing the sensor to responsively generate an output signal exceeding a threshold established for the amplifier 58. The motor drive control 55 immediately responds at step 64 by terminating the drive provided to the follower via the motor drive amplifier 54 and motor 52. Terminating the motor drive terminates the lowering of the magazine 41.

The wafers 13 are removed from the magazine 41 by lowering the magazine so that the lower-most wafer engages the conveyor belts 31 to be lifted off the supporting ledges 48 of the magazine 41. Once thusly engaged by the conveyor 31, the lower-most wafer 13 is removed from the magazine 41 by the moving conveyor without the intervention of any other means. To accomplish this without unnecessarily exposing the wafers 13 to potentially damaging handling, it is preferred that the moving conveyor 31 be stopped at the time when magazine 41 is lowered to place the lower-most wafer 13 on the conveyor. In this regard, the motor drive control 55 issues a send wafer out command at step 66 after the radiation sensor 18 detects a wafer 13 being positioned at the desired location. This command is coupled to the motor drive amplifier 53, which responsively drives the conveyor motor 38 to move the conveyor 31 in a direction that withdraws the lower most wafter 13 from the magazne 41. In addition, the motor drive control 55 monitors its input 59 for the receipt of a wafer received signal from an external device (not shown) to which wafers are conveyed by the semiconductor wafer handling apparatus 22. Receipt of this signal is tested at step 67. Upon receipt of the wafer received signal from the external device, the motor drive control 55 responds at step 68 to remove the send wafer out command provided to the motor drive amplifier 53 and terminate the drive of the conveyor motor 38. Execution of step 68 stops the movement of the conveyor 31 and conditions the motor drive control 55 at step 69 to be ready for the execution of the next wafter send or receive command provided at input 56.

Following the generation of the send wafer out command, the motor drive control 55 initiates a time-out interval. While the motor drive control 55 waits for the receipt of a wafer received signal, the motor drive control tests the duration of the time-out interval at step 70. The motor drive control 55 continues to provide the send wafer out command to the motor drive amplifier during the time-out interval, unless a wafer received signal is received at the input 59 as described hereinbefore. If the time-out interval expires before receipt of a wafer received signal, however, the motor drive control 55 executes step 68 as previously described to remove the send wafer out command provided to the motor drive amplifier and ready the motor drive control 55 for the execution of the next wafer send or receive command provided at input 56.

The operation of the motor drive control 55 in unloading wafers 13 from the moving conveyor 31 to a magazine is quite similar to that described with respect to unloading wafers from the magazine to the conveyor. The difference is the magazine 41 is controlled to load wafers from the conveyor starting at the top of the magazine. The operation of the motor drive control 55 in receiving wafers 13 from the conveyor 31 will be described assuming the upper-most empty wafer location within the magazne 41 is positioned for receipt of a wafer 13 carried by the conveyor 31. The motor drive control 55 waits for the receipt of an operator initiated wafer receive command at stop 71. Upon receipt of the wafer receive command at input 56, the motor drive control 55 responsively generates and issues a send wafer in command at step 72. This later command is coupled to the motor drive amplifier 53 which responsively drives the conveyor motor 38 to move the conveyor 31 in a direction that delivers wafers 13 to the magazne 41. The motor drive control 55 drives the conveyor 31 until the specular proximity detector 11 detects a wafer 13 entering the magazine 41. The motor drive control 55 tests for the presence of such a wafer at step 73. As long as a wafer is not detected, the motor drive control 53 commands the motor drive amplifier 53 to drive the conveyor motor 38. However, when the specular proximity detector 11 provides signal at input 57 to the motor drive control 55 indicative of a wafer 13 entering magazine 41, the motor drive control responds at step 74 to remove the send wafer in command provided to the motor drive amplifier 53. This terminates the drive to the conveyor moor 38 and stops the conveyor 31. In the preferred embodiment of the wafer handling apparatus 22, the specular proximity detector 11 is located to detect the resence of wafers at a position near the front edge 47 (FIG. 2) of magazine 41 adjacent the end of the conveyor 31. Therefore, the removal of the send wafer in command is delayed for a preselected interval to permit the detected wafer 13 to be fully inserted into the magazine 41 by the operation of the conveyor 31. After the conveyor 31 is stopped, the motor drive control 55 issues a raise magazing command at step 76. This command is coupled to the motor drive amplifier 54, which responsively drives the motor 52 operatively associated with the screw follower 51 (FIG. 2) to cause the follower to travel upward along the lead-screw 49. The drive interval is selected so that the follower 51 moves a distance along the lead-screw 49 corresponding to that necessary to raise the platform 42 and magazine 41 a distance of one wafer position. This operation positions the next empty wafer location of the magazine for receiving a wafer from the conveyor 31 and conditions the motor drive control 55 so that it is ready to execute the next wafer send or receive command.

Specific circuitry details of the motor drive control 55 for executing the steps illustrated in FIG. 4 are not critical and can be of routine design. Therefore, a description of the circuitry details has been omitted as unnecessary to the understanding of the claimed invention.

Reference is not directed to FIG. 1B, which illustrates a cross section elevation view of a preferred construction of the specular proximity detector 11 arranged for use in the semiconductor wafer handling apparatus 22 of the present invention. In the preferred embodiment, the specular proximity detector 11 includes a housing in the form of includes a generally rectangular body 81 constructed of plastic. The body 81 defines a pair of blind cylindrical holes or retaining the quartz cylindrical lenses 14b and 17b. The cylindrical quartz lenses 14b and 17b are selected to have different diameters to facilitate construction of a compact package. The cylindrical lens 17b has a smaller diameter and shorter focal length than cylindrical lens 14b and is located a distance from the site 16 (FIG. 1A) greater than its focal length. This facilitates the formation of a short radiation reflection path in which reflected radiation is focused at an image plane located between the spaced apart cylindrical lens 17b and spherical lens 17a before reaching the radiation sensor 18. The blind holes and major axes of the cylindrical lenses extend in the direction perpendicular to the sheet containing FIG. 1b. Extending into the plastic body 81 from one of its sides 82 is a cylindrical channel 83. The channel 83 extends along a line defining the incident radiation path and opens into the side of the cylindrical hole carrying the quartz lens 14b. The configuration of the channel 83 is selected to retain the combined emitter 12/spherical lens 14a package of the aforedescribed model OP-132 device.

Another cylindrical channel 84 extends into the plastic body 81 from a side 86 opposte side 82 along a line defining the reflected radiation path and opens into the side of the cylindrical hole carrying the quarts lens 17b. The channel 84 is configured to retain a cup-shaped optical stop member 87 and the combined sensor 18/spherical lens 17a package of the aforedescribed model OP-830 device. The cup-shaped stop 87 includes a cylindrical wall 88 extending perpendicularly from a circular web 89. The web 89 defines three apertures 91 along a line extending through its center in a direction coextensive with focused line of radiation formed by the cylindrical lens 17b. In FIG. 1B, the apertures 91 are disposed along a line that is perpendicular to the sheet containing FIG. 1B.

Emitted radiation leaves and reflected radiation enters the body 81 through a slot 92 cut into the top surface 93 of the body. The slot 92 opens into each of the cylindrical holes provided for the lens 14b and 17b over the entire length of each cylindrical hole and for a circumferential distance about each cylindrical hole so that the emitted radiation is projected to the selected site 16 and the radiation reflected from the selected site is directed to the sensor 18 without significant loss as a result of interception by the walls of the body 81. To facilitate coupling of the emitter 12 and sensor 18 to electrically control circuitry, the body 81 is provided with a channel 94 extending between its opposiite walls 82 and 86 for passage of electrical leads.

While one preferred embodiment of the specular proximity detector and article handling apparatus has been disclosed in detail and certain variations of that embodiment discussed, it will be apparent to those skilled in the art that various modifications and changes may be made in the preferred embodiment of the present invention and the specifically discussed variations without departing from the scope of the present invention as set forth in the following appended claims.

What I claim is:

1. A specular proximity detecor comprising:
    means for directing radiation along an incidence path to a line substantially free of optical diffusion extending for a length transverse to said incidence path at a selected location along said incidence path;
    a radiation sensor; and
    a first converging line-focusing optical element disposed along a reflection path to intercept radiation reflected from the selected location and direct it to the radiation sensor, the first converging line-focusing optical element positioned along the reflection path relative to the selected location and the radiation sensor to direct a greater amount of radiation to said radiation sensor when such radiation is reflected from said selected location that when reflected from locations away from said selected location.

2. The detector of claim 1 wherein the first converging line-focusing optical element is positioned relative to the selected location to focus radiation reflected therform at an image plane between said first converging line-focusing optical element and the radiation sensor, and further comprising a stop positioned between the first converging line-focusing optical element and the radiation sensor to pass reflected radiation from said first converging line-focusing optical element to said radiation sensor that is focused from the selected location to the image plane while preventing passage of radiation reflected from locations other than said selected location.

3. The detector of claim 1 or claim 2 wherein the first converging line-focusing optical element has a selected focal length and is positioned a distance from the selected location greater than the focal length.

4. The detector of claim 1 or claim 2 further comprising means responsive to the radiation sensor for generating a signal indicative of radiation reflected from an object at the selected location.

5. The detector of claim 1 further comprising a first converging point-focusing optical element positioned between the first converging line-focusing optical element and the radiation sensor for directing to said radiation sensor radiation reflected from the selected location.

6. The detector of claim 5 further comprising a stop positioned between the first converging line-focusing optical element and the first converging point-focusing optical element to pass reflected radiation from said first converging line-focusing optical element to said first converging point-focusing optical element that is focused from the selected location to the image plane while preventing passage of radiation reflected from locations other than said selected location.

7. The detector of claim 5 or claim 6 wherein the first converging line-focusing optical element is a cylindrical lens, and the first converging point-focusing optical element is a spherical lens.

8. The detector of claim 1 wherein said means for directing radiation along an incidence path comprises:
    a radiation emitter; and
    a second converging line-focusing optical element having a selected focal point, disposed to receive radiation from the radiation emitter and focus it along the line at the selected location, said radiation emitter and said second converging line-focusing optical element together defining an incidence path extending to the selected location, said incidence path being substantially free of optically diffusive elements.

9. The detector of claim 8 further comprising means responsive to the radiation sensor for generating a signal indicative of radiation reflected from an object at the selected location.

10. The detector of claim 8 wherein the first converging line-focusing optical element is positioned relative to the selected location to focus radiation reflected therefrom at an image plane between said first converging line-focusing optical element and the radiation sensor, and further comprising a first converging point-focusing optical element positioned between the first converging line-focusing optical element and the radiation sensor for directing to said radiation sensor radiation reflected from the selected location and focusing at the image plane.

11. The detector of claim 10 further comprising a stop positioned between the first converging line-focusing optical element and the first converging point-focusing optical element to pass reflected radiation from said first converging line-focusing optical element to said first converging point-focusing optical element that is focused from the selected location to the image plane while preventing passage of radiation reflected from locations other than said selected location.

12. A semiconductor wafer handling apparatus comprising:
    a semiconductor wafer conveyor;
    means for transferring semiconductor wafers with respect to the semiconductor wafer conveyor at a selected location relative to said conveyor;
    means for forming a focused line of radiation at the selected location for reflection therefrom when a semiconductor wafer is positioned at said selected location for transfer with the semiconductor wafer conveyor;
    means for receiving reflected radiation and focusing same to a line; and means for sensing radiation disposed to receive the reflected and line focused radiation and generate an indication of radiation reflected from the selected location.

13. The apparatus of claim 12 wherein the radiation sensing means is coupled to control the transferring means and the semiconductor wafer conveyor in accordance with the sensed reflected radiation.

14. The apparatus of claim 13 wherein the transferring means includes a magazine for storing a plurality of semiconductor wafers, said magazine is positionable relative to the semiconductor wafer conveyor for transferring semiconductor wafers with respect thereto, the semiconductor wafer conveyor is controllable for selective conveyance of semiconductor wafers, and the radiation sensing means is coupled to the positionable magazine and controllable semiconductor wafter conveyor for controlling the positioning of said magazine and selective conveyance by said semiconductor wafer conveyor in accordance with the sensed reflected radiation.

15. The apparatus of claim 12 wherein the transferring means is located at one end of the semiconductor wafer conveyor for transferring semiconductor wafers with respect thereto, and the selected location of the focused line of radiation is adjusted said one end of the semiconductor wafer conveyor.

16. A specular proximity detector of integral construction comprising:
 a housing defining opposite first and second sides and a third side joining said first and second opposite sides;
 first and second converging cylindrical lenses each having a longitudinal axis, said cylindrical lenses mounted adjacent to each other within the housing proximate the third side thereof with their longitudinal axes parallel and extending in the direction of the opposite first and second sides;
 the third side of the housing defining an opening exposing the cylindrical lenses to the exterior of said housing, the opening extending a first distance between the opposite first and second sides of the housing to expose a length of the cylindrical lenses and a second distance in the direction between the longitudinal axes of the cylindrical lenses less than the distance separating said longitudinal axes;
 a radiation emitter mounted within the housing at a side of the second converging cylindrical lense opposite the opening defined by the third side of the housing to direct radiation towards said second converging cylindrical lens generally in the direction of a radiation incidence path extending through the longitudinal axis of said second converging cylindrical lens, said opening defined by the third side of the housing and a point exterior to the housing at which emitted radiation is focused in a substantially diffusion free manner to a line by said second converging cylindrical lens; and
 a radiation sensor mounted within the housing at a side of the first converging cylindrical lens opposite the opening defined by the third side of the housing to receive radiation reflected from the point exterior to the housing generally in the direction of a radiation reflection path extending through said opening defined by the third side of the housing and the longitudinal axis of said first converging cylindrical lens.

17. The detector of claim 16 wherein the first converging cylindrical lens and the radiation sensor are mounted within the housing spaced from each other, the first converging cylindrical lens is positioned relative to the selected location to focus radiation reflected therefrom at an image plane between said first converging cylindrical lens and the radiation sensor, and further comprising a stop mounted within the housing between the first converging cylindrical lens and the radiation sensor to pass reflected radiation from said first converging cylindrical lens to said radiation sensor that is focused from the selected location to the image plane while preventing passage of radiation reflected from locations other than said selected location.

18. The detector of claim 16 or claim 17 further comprising a first converging spherical lens mounted within the housing between the first converging cylindrical lens and the radiation sensor for directing said radiation sensor radiation reflected from the selected location and focused at the image plane.

19. The detector of claim 18 wherein the first converging cylindrical lens has a diameter and a focal length less than those of the second converging cylindrical lens.

20. The detector of claim 18 further comprising a second converging spherical lens mounted within the housing between the radiation emitter and the second converging cylindrical lens to receive radiation from said radiation emitter and direct it to said second converging cylindrical lens.

21. The detector of claim 16 wherein the housing is a solid body defining spaces therein for retaining the first and second converging cylindrical lenses, the radiation emitter and the radiation sensor, the spaces for retaining the radiation emitter and the radiation sensor opening to the exterior of the solid body to provide access for electrical connection to said radiation emitter and said radiation sensor.

* * * * *